United States Patent [19]
Yokoyama

[11] 4,087,760
[45] May 2, 1978

[54] TRANSISTOR AMPLIFIER CIRCUIT

[75] Inventor: Kenji Yokoyama, Hamamatsu, Japan

[73] Assignee: Nippon Gakki Seizo Kabushiki Kaisha, Hamamatsu, Japan

[21] Appl. No.: 766,592

[22] Filed: Feb. 8, 1977

[30] Foreign Application Priority Data

Feb. 10, 1976 Japan .................................. 51-12884

[51] Int. Cl.² .......................................... H03F 3/183
[52] U.S. Cl. .................................... 330/265; 330/267
[58] Field of Search ............................. 330/13, 25, 28; 179/1 A; 307/313

[56] References Cited

U.S. PATENT DOCUMENTS

3,537,023  10/1970  Myer ...................................... 330/13

Primary Examiner—James B. Mullins
Attorney, Agent, or Firm—Cushman, Darby & Cushman

[57] ABSTRACT

A transistor amplifier circuit comprising a pair of complementary transistors having collectors connected to each other through a resistor and to an output terminal through respective capacitors, emitters connected to a positive and a negative supply voltage respectively and bases connected to the collectors thereof through respective resistors and to an input terminal through respective capacitors. In this amplifier circuit, the emitter circuits of the paired-transistors include no resistors and accordingly no by-pass capacitors, thus eliminating thermal noise sources and also voltage drop due to such resistors. Therefore, this amplifier circuit can be operated at a markedly reduced S/N ratio with a very low supply voltage, giving a high utility of voltage. Such amplifier circuit can have a very simplified structure.

8 Claims, 4 Drawing Figures

FIG. 1 PRIOR ART
FIG. 4
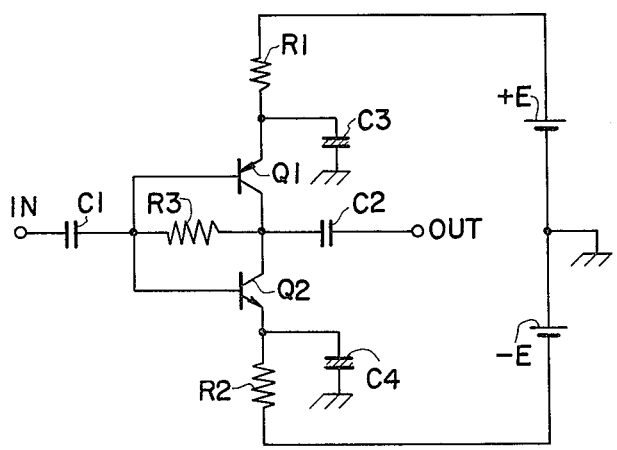
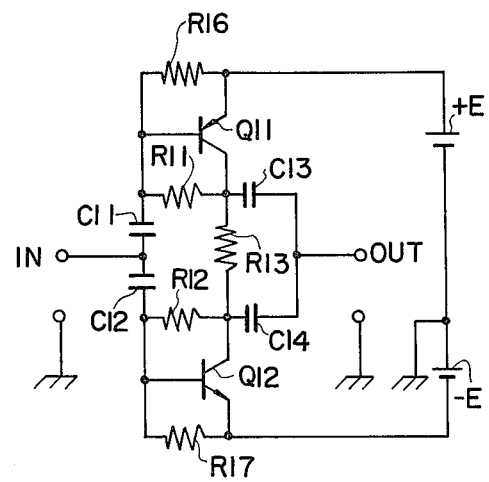
FIG. 2
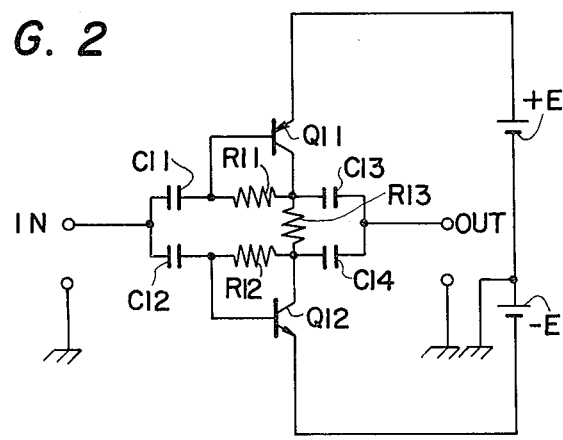
FIG. 3
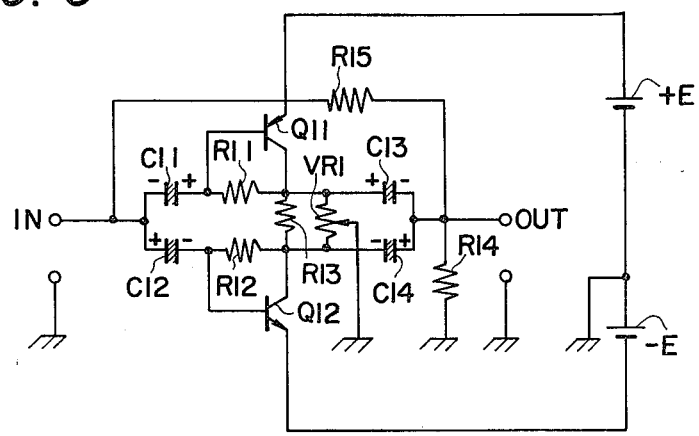

TRANSISTOR AMPLIFIER CIRCUIT

BACKGROUND OF THE INVENTION a. Field of the Invention

This invention relates to a push-pull type transistor amplifier circuit using complementary transistors and more particularly to an improvement of the signal-to-noise (S/N) ratio thereof.

b. Description of the Prior Art

FIG. 1 shows an example of a complementary single-ended push-pull amplifier circuit disclosed in the Japanese Pat. Application No. 50-104085. In this amplifier circuit, collectors of complementary transistors Q1 and Q2 are directly connected with each other; emitters thereof are respectively connected with positive and negative supply voltage sources +E and −E through resistors R1 and R2; and bases thereof are connected with each other and with the common collector through a feed-back resistor R3. Capacitors C3 and C4 form by-pass circuits and capacitors C1 and C2 are coupling capacitors for an input terminal IN and for an output terminal OUT. In such a circuit, collectors of transistors Q1 and Q2 are kept at the mid-potential, i.e. at ground potential, and little current is allowed to flow through the resistor R3 when there is no signal and the potential difference between the collectors and the bases of the transistors Q1 and Q2 is almost zero. Therefore, the leakage current $I_{CBO}$ between the collector and the base of the transistors Q1 and Q2 is nearly zero so that the transistors Q1 and Q2 scarecely produce excess noises and hence the S/N ratio is remarkably improved.

The previously disclosed circuit as mentioned above has an advantage of effectively suppressing the generation of excess noises in the transistors Q1 and Q2. On the other hand, however, it is necessary to connect resistors R1 and R2 with the emitters of the transistors Q1 and Q2 for determining the collector current of the transistors Q1 and Q2 and compensating for the temperature dependence thereof. The thermal noise produced in the resistors R1 and R2 may form a factor for the deterioration of the S/N ratio, and the utilization, i.e. the effective range, of the supply voltage tends to decrease due to the voltage drop in the resistors R1 and R2. Besides, by-pass capacitors C3 and C4 become necessary for the insertion of resistors R1 and R2 and generally should have large capacitances since the impedance is fairly low. Furthermore, when the characteristics of the transistors Q1 and Q2 differ from each other, the two resistors R1 and R2 must be variable resistors, which makes the circuit construction more complicated.

SUMMARY OF THE INVENTION

Therefore, an object of this invention is to provide a transistor amplifier circuit having a simpler circuit construction and a better S/N ratio. According to an aspect of this invention, collectors of a pair of complementary transistors are connected with each other through a resistor, the bases thereof are connected with the collectors through resistors respectively, and the emitters thereof are connected with a positive and a negative supply voltage sources, respectively.

Other objects, features and advantages of this invention will become apparent from the following description of the preferred embodiments when taken in conjunction with the accompanying drawings.

BRIEF DESCRIPTION OF THE DRAWINGS

FIG. 1 is a circuit diagram showing a conventional circuit.

FIGS. 2 to 4 are circuit diagrams of amplifiers according to various embodiments of this invention.

DESCRIPTION OF THE PREFERRED EMBODIMENTS

FIG. 2 shows the most basic complementary single-ended push-pull amplifier circuit according to this invention. The emitters of a pair of complementary transistors Q11 and Q12 are directly connected with positive and negative voltage supply sources +E and −E, respectively, and the collectors thereof are connected with each other through a resistor R13 and each of the bases thereof is connected with each collector through a resistor R11 or R12. Both ends of the resistor R13 are shunted by capacitors C13 and C14 to shunt the ac components, and the output terminal OUT is drawn out from the interconnection point of the capacitors C13 and C14. The capacitors C13 and C14 are generally of similar capacitance. The bases of the transistors Q11 and Q12 are connected through capacitors C11 and C12 to be shunted in the ac components and the input terminal IN is drawn out from the interconnection point of the capacitors C11 and C12. Here, the capacitors C11 and C12 are also generally of similar capacitance.

In such a circuit construction, it is apparent that the following equation holds:

$$2E \approx 2V_{BE} + I_B(R11 + R12) + I_O R13,$$

where $V_{BE}$ is the voltage between the base and the emitter of the transistors Q11 and Q12, $I_B$ is the base current of the transistors Q11 and Q12, $I_O$ is the circuit current flowing between the supply voltage sources +E and −E. The above equation is based on the assumption that the base current $I_B$ is extremely smaller than the circuit current $I_O$. As is easily seen from the above equation, it is possible to freely determine the circuit current, i.e. the operation point of the transistors Q11 and Q12 by adjusting the resistance of the resistor R13. Also, the temperature stabilization or compensation is achieved satisfactory without inserting resistors in the emitter circuit but with the dc feed-back from the collectors to the bases of the transistors Q11 and Q12 through the resistors R11 and R12.

Thus, in the above embodiment, the insertion of resistors in the emitter circuit becomes unnecessary, resulting in the improvement of the S/N ratio as far as the thermal noises produced in the resistors is concerned. Besides, the circuit construction is simplified in that the by-pass capacitor becomes unecessary because no resistor is inserted in the emitter circuit. As a matter of course, it is possible to greatly reduce the excess noise due to the leakage current $I_{CBO}$ of the transistors Q11 and Q12 by properly determining the resistance of the resistors R11 and R12 to reduce the inverse voltage between the collector and the base of the transistors Q11 and Q12.

FIG. 3 shows another embodiment in which, for the purpose of preventing the occurrence of second order distortion due to the asymmetry of transistors Q11 and Q12, a potentiometer VR1 is connected in parallel with the resistor R13 with the grounded sliding contact. In this circuit, assuming that the resistance of the potentiometer VR1 is larger enough than that of the resistor R13 and that the impedance of the signal source connected to the input terminal IN is smaller enough than the combined resistance of the parallel resistors R11 and R12, the gains $G_1$ of the transistor Q11 and $G_2$ of the transistor Q12 are expressed in the following equations:

$$G_1 \approx \frac{h_{fe1} \cdot (R11//R12//kVR1)}{h_{ie1}},$$

$$G_2 \approx \frac{h_{fe2} \cdot [R11//R12//(1-k)VR1]}{h_{ie2}},$$

where $0 < k < 1$, $h_{fe1}$ and $h_{fe2}$ are forward current amplification factors of the transistors Q11 and Q12, respectively, in the emitter grounded closed loop circuit for small signals, $h_{ie1}$ and $h_{ie2}$ are input impedances of transistors Q11 and Q12, respectively, in the emitter grounded closed loop circuit for small signals, R11//R12//kVR1 is the combined parallel resistance of the resistors R11 and R12 and the upper part of the potentiometer VR1 from the collector of the transistor Q11 to the sliding contact, R11//R12//(1-k) VR1 is the combined parallel resistance of the resistors R11 and R12 and the lower part of the potentiometer VR1 from the collector of the transistor Q12 to the sliding contact.

Thus, by appropriately selecting the value of $k$ by adjusting the position of the sliding contact of the potentiometer VR1, it is possible to correct the asymmetry of the characteristics of the transistors Q11 and Q12. Namely, the gains $G_1$ and $G_2$ of the transistors Q11 and Q12 can be arranged equal and, consequently, the occurrence of second order distortion can be prevented. A resistor R15 connects the output terminal with the input terminal to effect negative feed-back. The resistor R15 may be dispensed with when no feed-back is required.

FIG. 4 shows a circuit in which resistors R16 and R17 are inserted between emitters and bases of transistors Q11 and Q12, respectively, for improving the utilization of the supply voltage. When the current amplification factors of the transistors Q11 and Q12 are large enough, the following equations apparently hold:

$$V_{CE1} \approx V_{BE1} + \frac{V_{BE1}}{R16} \cdot R11,$$

$$V_{CE2} \approx V_{BE2} + \frac{V_{BE2}}{R17} \cdot R12,$$

where $V_{BE1}$ and $V_{BE2}$ are the voltages between the base and the emitter of the transistors Q11 and Q12, and $V_{CE1}$ and $V_{CE2}$ are the voltages between the collector and the emitter of the transistors Q11 and Q12. As seen from the above equation, the voltages between the collector and the emitter of the respective transistors, $V_{CE1}$ and $V_{CE2}$, can be freely determined by the resistances of the resistors R11, R12, R16 and R17. The circuit current is determined by the resistor R13.

As stated above, the transistor amplifier circuit of this invention has such advantages that the S/N ratio is improved because the emitter circuit of the transistors includes no resistors which can be the source of noise, that the circuit can be operated with a very low supply voltage due to the abscence of no voltage drop by such resistors in the emitter circuit and thus the voltage utilization is high, and that the by-pass capacitor of the emitter circuit becomes unnecessary. Furthermore, due to the complementary push-pull construction, this circuit has such other advantages that the distortion in even order harmonics is small and that the creation of second order distortion caused by the asymmetry of the transistors can easily be eliminated by using a potentiometer as part of the resistance connected between the collectors of the transistors and adjusting the ground potential point of the potentiometer.

I claim:
1. A transistor amplifier circuit comprising:
a pair of complementary transistors having respective collectors, bases and emitters;
a first ohmic resistance means connected between said collectors;
a positive and a negative supply voltage terminal directly connected with said emitters of said pair of complementary transistors respectively; and
a pair of second ohmic resistance means, each being connected between the base of each of said transistors and the interconnection point of said first ohmic resistance means and the collector of each of said transistors, respectively.

2. A transistor amplifier circuit according to claim 1, wherein said first ohmic resistance means comprises a parallel connection of a fixed resistor and a potentiometer having a sliding terminal connected to a predetermined potential.

3. A transistor amplifier circuit according to claim 1, wherein said first ohmic resistance means comprises a parallel connection of a fixed resistor and a potentiometer having a grounded sliding terminal.

4. A transistor amplifier circuit according to claim 3, wherein the combined resistance of said parallel connection is mainly determined by said fixed resistor.

5. A transistor amplifier circuit according to claim 1, further comprising a pair of third resistance means connected between the emitter and the base of said transistors, respectively.

6. A transistor amplifier circuit according to claim 1, further comprising an input and an output terminal, a pair of first capacitors connected between said input terminal and the bases of said transistors respectively, and a pair of second capacitors connected between said output terminal and the collectors of said transistors respectively.

7. A transistor amplifier circuit according to claim 6, further comprising fourth resistance means connected between said output and said input terminals.

8. A transistor amplifier circuit according to claim 1, wherein said first ohmic resistance means comprises variable resistance between said collectors and a predetermined potential point.

* * * * *